United States Patent [19]

Ibe

[11] Patent Number: 4,969,745

[45] Date of Patent: Nov. 13, 1990

[54] DEVICE FOR MEASURING OFFSET OF AXIS OF CRYSTAL LIFTING WIRE

[75] Inventor: Hiroyuki Ibe, Hukui, Japan

[73] Assignee: Shin-Etsu Handotai Company, Limited, Tokyo, Japan

[21] Appl. No.: 438,284

[22] Filed: Nov. 20, 1989

[30] Foreign Application Priority Data

Nov. 21, 1988 [JP] Japan .................. 63-294094

[51] Int. Cl.⁵ .............................. G01B 11/00
[52] U.S. Cl. .................. 356/375; 250/561; 156/601; 422/249
[58] Field of Search .......... 356/373, 375; 250/561; 156/601; 422/249

[56] References Cited

U.S. PATENT DOCUMENTS 4,794,263 12/1988 Katsuoka et al. ............... 422/249
4,915,775 4/1990 Katsuoka et al. ............... 156/601

*Primary Examiner*—F. L. Evans
*Attorney, Agent, or Firm*—Browdy and Neimark

[57] ABSTRACT

A device used in a single-crystal production apparatus based on Czochralski method and designed for measuring the offset of the wire for lifting the growing crystal. In order to enable an easy and appropriate mounting and adjustment of the crystal lifting wire, while preventing abnormal oscillation of the axis of rotation of the growing crystal, the device has a block which fits in the upper end opening of a chamber. The block has a central through-hole which the wire penetrates. Light sources and photo-detectors are arranged to oppose each other across the through-hole. Slits are arranged between the wire and the photo-detectors. The device measures the offset from the outputs of the photo-detectors, and an alarm activates when the measured wire offset has exceeded an upper limit. In another form, the assembly including the block, light sources, photo-detectors and the slits is substituted by linear image sensor cameras.

9 Claims, 6 Drawing Sheets

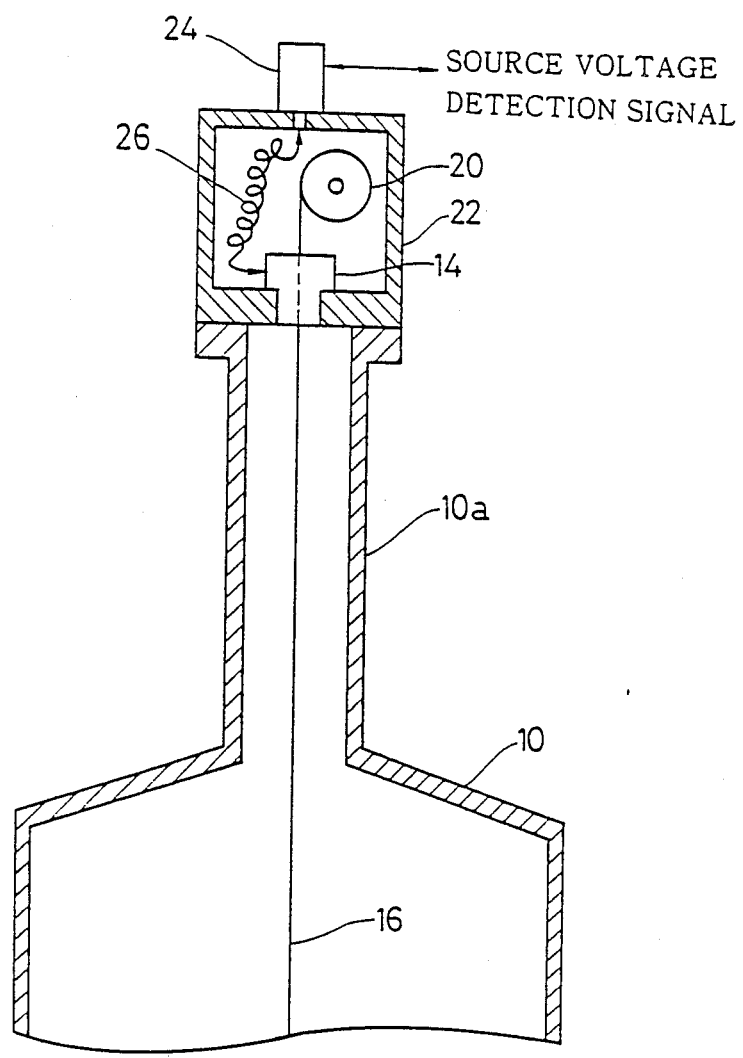
F I G. 2

DEVICE FOR MEASURING OFFSET OF AXIS OF CRYSTAL LIFTING WIRE

BACKGROUND OF THE INVENTION

1. Field of the Invention

The present invention relates to a device which is used in a single crystal production apparatus based upon Czochralski method and which is capable of measuring offset of the position of a crystal lifting wire from an expected position.

2. Description of the Related Art

In general, an apparatus for producing a single crystal based upon Czochralski method employs a wire or a shaft for lifting a grown single crystal. In order to reduce the overall height of the apparatus, a wire is preferably used rather than a shaft. The crystal lifting wire is suspended from an upper portion of the apparatus down to a rotary crucible containing a melt of the crystal's raw material. If the center axis of the crystal lifting wire is offset from the axis of rotation of the crucible, the growing crystal receives a force of appreciable level in the direction of crucible rotation from the melt surface so that the axis of rotation of the growing crystal is abnormally oscillated by the force, with the result that the the crystal does not grow in a cylindrical form and the growth cannot be continued.

Offset of the center axis of the crystal lifting wire from the axis of rotation of the crucible inevitably occurs due to, for example, a mechanical distortion of the crystal production apparatus or relative change in the constructive positions during a long use thereof, even though the lifting wire is initially set in axial alignment with the crucible, when the apparatus is newly installed.

It is therefore necessary that a periodical readjustment has to be conducted so as to reduce this offset to zero during use of the single crystal production apparatus, not to mention the adjustment at the time of the initial setting.

Unfortunately, no specific consideration has been given to this problem, and the readjustment has been conducted with the help of a naked eye without usage of any special measurement of the offset amount, so that an impractically long time is required for the centering of the lifting wire and the accuracy of the centering was not realized to be so high.

SUMMARY OF THE INVENTION

Accordingly, a first object of the present invention is to provide a device for measuring offset of a crystal lifting wire, which enables an easy and appropriate mounting and adjustment of a crystal lifting wire when a crystal production apparatus is assembled.

A second object of the present invention is to provide a device for measuring offset of a crystal lifting wire, which is capable of preventing any abnormal oscillation of rotation axis of growing crystal attributable to mechanical distortion of structural parts or relative change in the constructive positions between components incurred during long use of the apparatus.

(1) To this end, according to one aspect of the present invention, there is provided a device for measuring offset of a wire for lifting a crystal which is growing on the basis of Czochralski method, the device comprising: a light source for emitting light to the wire; a photo-detector arranged against the light source across the wire, converting the intensity of the light from the light source into electric signal; a slit disposed between the photo-detector and the wire, passing a part of the light beam directed from the light source to the photo-detector; means for determining the wire offset with respect to a certain position, from the outputs of the photo-detector; and means for displaying the wire offset.

In the assembly of the crystal production apparatus, an easy and accurate adjustment of the axis of the crystal lifting wire, axis of rotation of the crucible and so forth is possible when the adjustment is conducted with reference to the offset displayed on the display means of the offset measuring device.

The axis of the growing crystal lifting wire is gradually offset from the axis of the rotating crucible due to deformation of structural members of the crystal production apparatus during a long use of the apparatus. In consequence, an angular moment is applied by the surface of the melt to the growing crystal, with the result that the axis of rotation of the growing crystal is abnormally oscillates, with the result that the the crystal does not grow in a cylindrical form and the growth of the crystal cannot be continued.

According to the present invention, however, occurrence of such abnormal oscillation is avoided because the amount of offset can be continuously monitored even during the lifting of the crystal.

(2) In a preferred form of the device of the invention, there are two sets of the light source, the slit and the photo-detector arranged such that the optical axes of both sets are unparallel to each other, and wherein the means for determining the offset determine, by the outputs from two photo-detectors, the distance of the wire from the certain position as the wire offset.

With this arrangement, it is possible to correctly determine whether the amount of the offset is abnormally large without requiring the light sources and the photo-detectors to be moved, even when the wire oscillates such that a point thereon draws an elliptical locus and regardless of the direction of the longitudinal axis of such an elliptical locus.

(3) In a specific form of the present invention, the light source, the slit and the photo-detector are set to a block, the block having a through-hole which the wire penetrates and a fitting portion which fits in an opening formed in the upper end of a chamber which covers a crucible for a melt, the through-hole being formed such that, when the fitting portion fits in the opening, the axis of the through-hole coincides with the desired position of the wire. This arrangement permits a reduction in the size of the detecting section of the offset amount measuring device and remarkably facilitates the mounting of the detecting section.

(4) Any of the arrangements (1) to (3) set forth above may further comprise a means for setting the upper limit of the wire offset; an alarm; and means for activating the alarm when the detected wire offset has exceeded the upper allowable limit. This arrangement eliminates the necessity for the continuous monitoring of the wire offset and, hence, remarkably relieves the operator from laborious work.

In another aspect of the invention, there is provided a device comprising: a linear image sensor camera for imaging the horizontal position of said wire at a certain height; means for processing video signals from said linear image sensor camera and determining the wire offset with respect to a certain position; and means for displaying the determined wire offset.

According to this arrangement, it is possible to install the linear image sensor cameras outside the chamber, so that the wire offset can be measured at a position lower than that in the arrangements (1) to (4) described above. In consequence, the amount of offset to be detected is greater and, hence, the measuring accuracy is higher than those in the arrangements (1) to (4).

These and other objects, features and advantages of the present invention will become clear from the following description of the preferred embodiments when the same is read in conjunction with the accompanying drawings.

BRIEF DESCRIPTION OF THE DRAWINGS

FIG. 2 is a schematic illustration of an offset amount detection block used in the device of FIG. 1;

DESCRIPTION OF THE PREFERRED EMBODIMENTS

Figure 1:
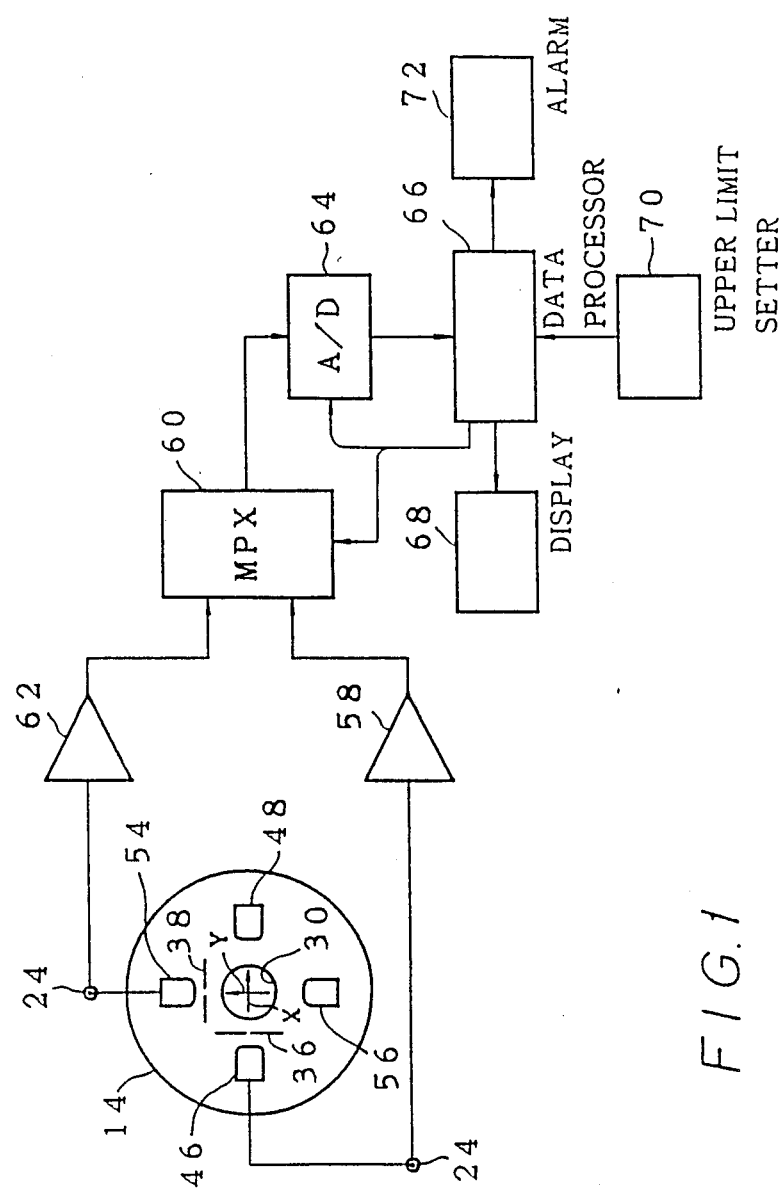
FIG. 1 is a block diagram of a first embodiment of the device of the invention for measuring offset of a crystal lifting wire.

Preferred embodiments of the present invention will be described with reference to the accompanying drawings.

(1) First Embodiment

Referring to FIG. 2, the apparatus has a chamber 10. The chamber 10 has a neck portion 10a at the upper portion which is attached a housing 22 rotatable about the axis of the chamber 10. An offset detection block 14 is mounted on the center of the bottom plate of the housing 22. A wire 16 for lifting a growing crystal is extended through a central through hole of the offset amount detection block 14. The wire 16 is wound on a take-up drum 20. The take-up drum 20 is fixed to the housing 22 and is encased in the same. The housing 22 is adapted to be rotatingly driven by a motor which is not shown. An initial setting is conducted such that the axis of rotation of the housing 22 coincides with the axis of the offset detection block 14 and the axis (not shown) of rotation of a crucible which is located in the chamber 10 at a lower portion. A slip ring 24 is attached to the center of the upper surface of the housing 22. The slip ring 24 and the offset detection block 14 are electrically connected to each other through a wire 26, so that a source voltage is supplied to the offset detection block 14 through the slip ring 24 and detection signal from the offset detection block 14 is delivered externally through the slip ring 24.

Figure 3:
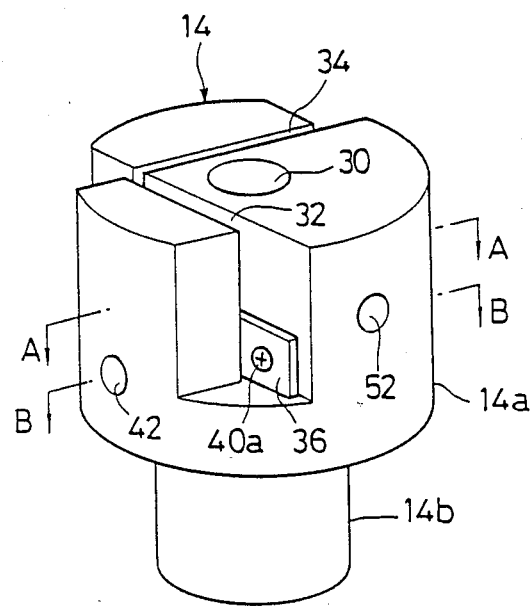
FIG. 3 is a perspective view of the offset amount detection block.
Figure 4A:
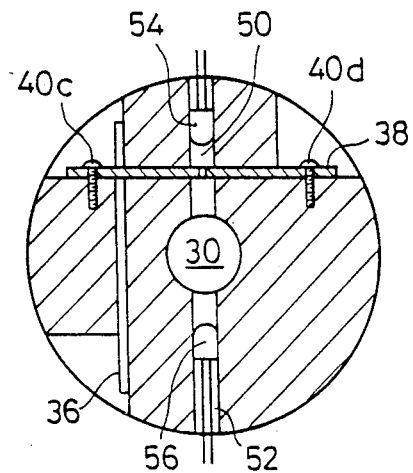
FIG. 4A is a cross-sectional view of the offset amount detection device taken along the line A—A of FIG. 3.
Figure 4B:
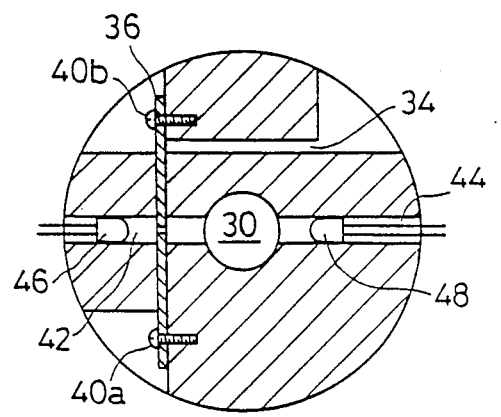
FIG. 4B is a cross-sectional view of the offset amount detection device taken along the line B—B of FIG. 3.

As shown in FIGS. 3 and 4A, 4B, the offset detection block 14 has a substantially cylindrical head portion 14a and a neck portion 14b of a diameter smaller than that of the head portion 14a, the head portion 14a and the neck portion 14b being constructed as a unit with each other from a synthetic resin. A through-hole 30 through which the wire 16 extends is formed in the center of the offset detection block 14. The head portion 14a has a groove parallel to the through-hole 30 and a groove 32 which also is parallel to the through-hole 30 and perpendicular to the groove 32.

A slit plate 36 is fitted in the groove 32, while another slit plate 38 fits in the groove 34. The slit plate 38 is positioned at a level above the slit plate 36. The slit plate 36 is fixed at its both ends to notches formed on both ends of the groove 32, by means of screws 40a, 40b. Similarly, the slit plate 38 is fitted at its both ends to the head 14 by means of screws 40c, 40d. The slit plates 36 and 38 are provided at their central portions with slits which are parallel to the axis of the through-hole 30. The slit plates 36, 38 may be formed by, for example, scribing slit lines in photographic films which have been changed into black color through exposure. Holes formed in both ends of the slit plates 36, 38 for receiving the fixing screws 40a, 40b, 40c and 40d are elongated in the longitudinal directions of the respective slit plates so that the positions of the slits are adjustable in the longitudinal directions of the slit plates 36, 38.

Holes 42, 44 are formed in the head portion 14a so as to orthogonally cross the groove 32 and so as to communicate with the through-hole 30. The hole 42 receives a photo-transistor 46, while the hole 44 receives a light-emitting diode 48. The head portion 14a further has holes 50, 52 which orthogonally cross the groove 34 and which communicate with the through-hole 30. The holes 50 and 52 receive, respectively, a photo-transistor 54 and a light-emitting diode 56.

As will be seen from FIG. 1, the photo-transistor 46 is connected to one of the input terminals of a multiplexer 60 through the slip ring 24 and an amplifier 58, while the photo-transistor 54 it connected to the other input terminal of the multiplexer 60 through the slip ring 24 and an amplifier 62. The multiplexer 60 alternatingly selects the outputs from the amplifiers 58 and 62 at a period of, for example, 100 msec, and delivers the selected output to an A/D converter 64 so that the selected amplifier output is converted into digital signals. The digital output from the A/D converter 64 is read by a data processing circuit 66 in synchronization with the data processing circuit 66.

Figure 5:
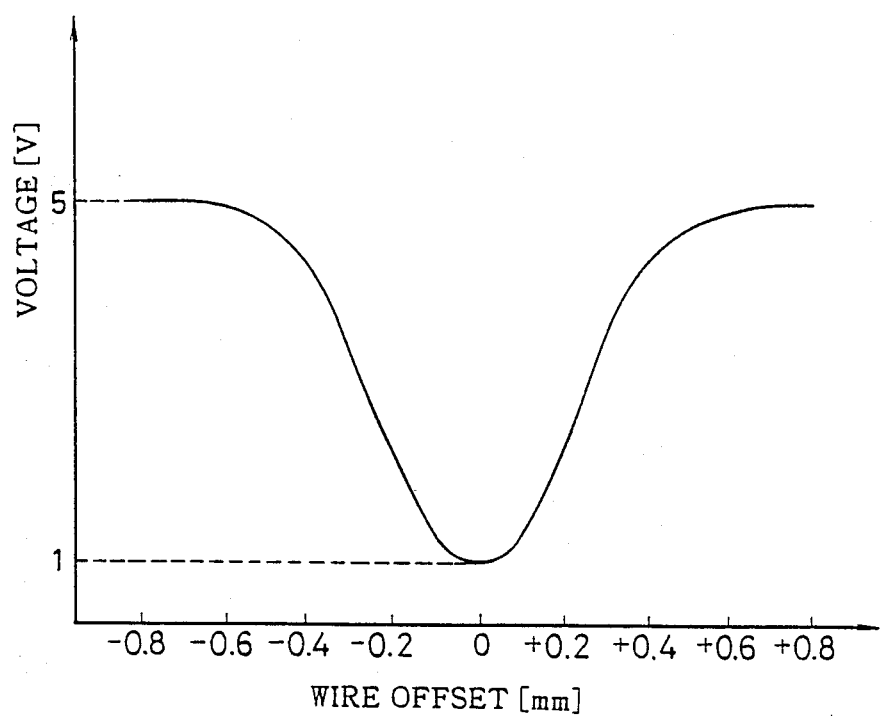
FIG. 5 is a diagram illustrating the result of measurement of the relationship between the amount of offset of the wire axis from the axis of a through hole and the output voltage of an amplifier.

The relationship between the offset of the axis of the wire from the center of the through-hole 30 and the output voltage of the amplifier 58 or the amplifier 62 was measured while varying the slit width of the slit plates 36 and 38. FIG. 5 shows the result of the measurement as obtained when the slit width was set to be 1/180 of the diameter of the wire 16. In this measurement, the gains of the amplifiers 58 and 62 were adjusted to provide minimum and maximum voltages of 1 V and 5 V, respectively, for each of the amplifiers. It is also to be noted that the surfaces of walls defining the holes 42, 44, 50 and 52 are light-reflective surfaces.

A data processing circuit 66 determines the X- and Y-coordinate values of the axis of the wire 16 with respect to the axis of the through-hole 30, by making use of the relationship shown in FIG. 5, and computes the offset distance S which is given by $S=(X^2+Y^2)^{\frac{1}{2}}$. Referring to FIG. 1, X-axis is assumed to be the line extending from the photo-transistor 46 towards the light-emitting diode 48 past the center of the through-hole 30, while the Y-axis is assumed to be the line which extends from the light-emitting diode towards the photo-transistor 54 past the through-hole 30. The data processing circuit 66 delivers the thus determined offset coordinate values (X, y) and the offset distance S to a display unit 68.

When the offset S exceeds a predetermined upper limit of the offset S which is set by an upper limit setting device 70, the data processing circuit 66 activates an alarm 72 so as to inform the operator of the fact that the offset is increased beyond the upper limit.

When the crystal production apparatus is assembled, an initial adjustment is conducted with reference to the display unit 68 displaying the offset, such that the axis of rotation of the crucible, axis cf rotation of the housing 22, axis of the offset detection block 14 and the axis of the wire 16 are all aligned.

During the long use of the crystal production apparatus, the offset is gradually increased due to mechanical distortion of the structural parts and, when the amount of offset exceeds the upper limit which is set by the upper limit setting device 70, the alarm 72 is activated to inform the operator that the offset has been increased beyond the upper limit. The operator then executes re-adjustment to obtain alignment in the same manner as the initial adjustment explained before.

(2) Second Embodiment

Figure 6:
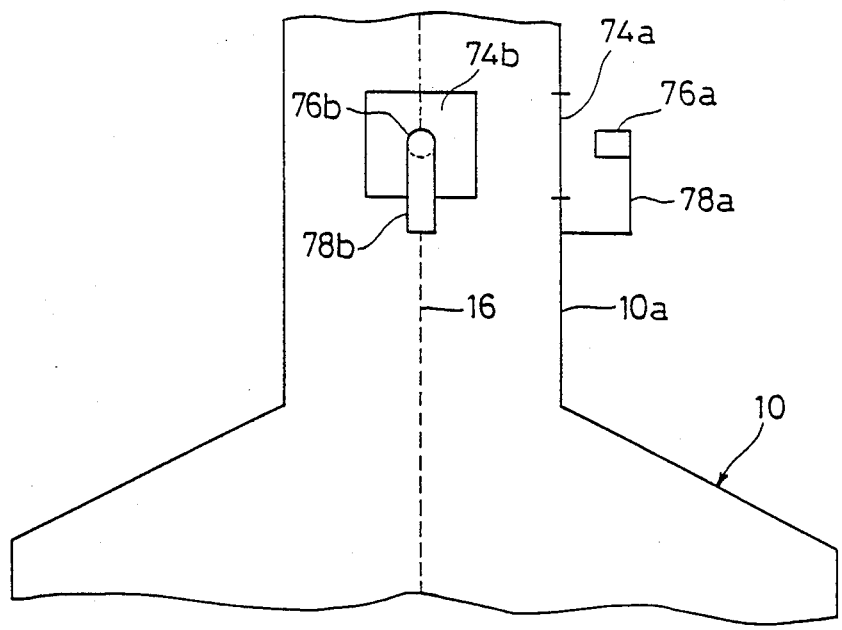
FIGS. 6 is a schematic illustration of the construction of a detection unit in a second embodiment of the device of the invention for measuring offset of a crystal lifting wire.

FIG. 6 shows the construction of a second embodiment of the offset measuring device of the present invention.

The chamber 10 has an intermediate portion 10a which is provided with windows 74a and 74b which are circumferentially spaced apart by 90° in terms of the angle about the axis of the intermediate portion 10a. A linear image sensor camera 76a is fixed through a bracket 78a to the intermediate portion 10a of the chamber 10 so as to sight the wire 16 through the window 74a. Similarly, a linear image sensor camera 76b is fixed through a bracket 78b to the intermediate portion 10a of the chamber 10 so as to sight the wire 16 through the window 74b.

Figure 7:
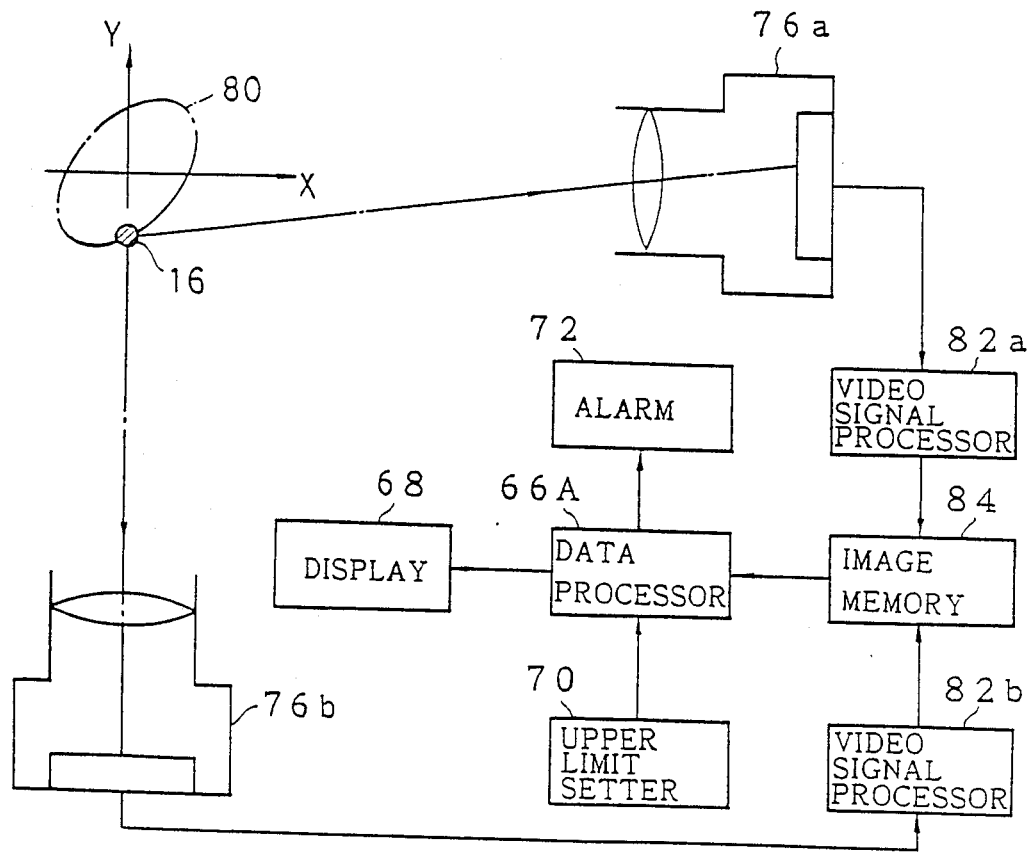
FIG. 7 is a block diagram of the second embodiment of the device of the invention for measuring offset of a crystal lifting wire.

Therefore, the image of the wire 16 is taken up in two orthogonal directions by means of the linear image sensor cameras 76a and 76b. The pixel signals delivered from these linear cameras are successively amplified and changed into digital signals by video signal processing circuit 82a, 82b and are written in an image memory 84. illuminance data thus written in the image memory 84 is read by a data processing circuit 66A which determines the coordinate (X, Y) of offset of the wire 16 and the offset S. Then, the alarm is activated as required in the same manner as the first embodiment. In FIG. 7, numeral 80 denotes the locus of the position of the wire 16 as detected by the linear image sensor cameras.

The second embodiment measures the offset of the wire 16 at a position which is lower than that in the first embodiment where the offset appears in a greater amount than that in the first embodiment. The second embodiment, therefore, offers a higher accuracy of measurement of the offset. The first embodiment, however, is much simple in construction and can have a compact construction as compared with the second embodiment.

What is claimed is:

1. A device for measuring offset of a wire for lifting a crystal which is growing on the basis of Czochralski method, said device comprising:

a light source (48, 56) for emitting light to said wire (16);
a photo-detector (46, 54) arranged against said light source across said wire, converting the intensity of the light from said light source into electric signal;
a slit (36, 38) disposed between said photo-detector and said wire, passing a part of the light beam directed from said light source to said photo-detector;
means (66) for determining the wire offset with respect to a certain position, from the outputs of said photo-detector; and
means (68) for displaying the wire offset.

2. A device according to claim 1, wherein there are two sets (48, 36, 46; 56, 38, 54) of said light source, said slit and said photo-detector arranged such that the optical axes of both sets are unparallel to each other, and wherein said means (66) for determining the offset determine, by the outputs from two photo-detectors, the distance of said wire from the certain position as the wire offset.

3. A device according to claim 1, wherein said light source (48. 56), said slit (36, 38) and said photo-detector (46, 54) are set to a block, said block having a through-hole (30) which said wire (16) penetrates and a fitting portion (14b) which fits in an opening formed in the upper end of a chamber which covers a crucible for a melt, said through-hole being formed such that, when said fitting portion fits in said opening, the axis of said through-hole coincides with the desired position of said wire.

4. A device according to claim 2, wherein said light sources (48, 56), said slits (36, 38) and said photo-detectors (46, 54) are set to a block, said block having a through-hole (30) which said wire (16) penetrates and a fitting portion (14b) which fits in an opening formed in the upper end of a chamber which covers a crucible for a melt, said through-hole being formed such that, when said fitting portion fits in said opening, the axis of said through-hole coincides with the desired position of said wire.

5. A device according to claim 1, further comprising:
means (70) for setting the upper limit of the amount of the wire offset; an alarm (72); and means (66) for activating said alarm when the detected wire offset has exceeded said upper limit.

6. A device according to claim 2, further comprising:
a means (70) for setting the upper limit of the wire offset; an alarm (72); and means (66) for activating said alarm when the detected wire offset has exceeded said upper limit.

7. A device according to claim 3, further comprising:
means (70) for setting the upper limit of the wire offset; an alarm (72); and means (66) for activating said alarm when the detected wire offset has exceeded said upper limit.

8. A device according to claim 4, further comprising:
a means (70) for setting the upper limit of the wire offset; an alarm (72); and means (66) for activating said alarm when the detected wire offset has exceeded said upper allowable limit.

9. A device for measuring offset of a wire for lifting a crystal which is growing on the basis of Czochralski method, said device comprising:
a linear image sensor camera (76a, 76b) for imaging the horizontal position of said wire (16) at a certain height;
means (82a, 82b, 84, 86) for processing video signals from said linear image sensor camera and determining the wire offset with respect to a certain position; and
means (68) for displaying the determined wire offset.

* * * * *